United States Patent
Izutsu (10) Patent No.: US 6,859,386 B2
(45) Date of Patent: Feb. 22, 2005

(54) SEMICONDUCTOR MEMORY DEVICE WITH MEMORY CELL HAVING LOW CELL RATIO

(75) Inventor: Takashi Izutsu, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 9 days.

(21) Appl. No.: 10/602,050

(22) Filed: Jun. 24, 2003

(65) Prior Publication Data

US 2004/0130931 A1 Jul. 8, 2004

(30) Foreign Application Priority Data

Dec. 16, 2002 (JP) ........................................ 2002-363600

(51) Int. Cl.[7] .............................................. G11C 11/00
(52) U.S. Cl. ........................ 365/154; 365/190; 365/203
(58) Field of Search ................................ 365/154, 156, 365/190, 203

(56) References Cited

U.S. PATENT DOCUMENTS 6,141,240 A * 10/2000 Madan et al. ................ 365/156
6,160,733 A * 12/2000 Ebel .............................. 365/154
6,650,580 B1 * 11/2003 Braceras ........................ 365/201

FOREIGN PATENT DOCUMENTS

JP          62-257698        11/1987
JP          63-128662         6/1988

* cited by examiner

Primary Examiner—Tan T. Nguyen
(74) Attorney, Agent, or Firm—McDermott Will & Emery LLP (57) ABSTRACT

In a memory cell, the cell ratio between an N-channel MOS transistor as a driver transistor and an N-channel MOS transistor as an access transistor is 1. To the first and second storage nodes, capacitors are connected, respectively. A word line driver receives a voltage obtained by boosting a power source voltage from a boosted power source voltage generating circuit and activates a word line with the boosted voltage. A bit line precharge circuit precharges bit lines to the power source potential when the word line is inactivated in accordance with a signal outputted from a BLPC signal generating circuit.

12 Claims, 10 Drawing Sheets

SEMICONDUCTOR MEMORY DEVICE WITH MEMORY CELL HAVING LOW CELL RATIO

BACKGROUND OF THE INVENTION

1. Field of the Invention

The present invention relates to a semiconductor memory device, and more particularly to a semiconductor memory device having static memory cells.

2. Description of the Background Art

An SRAM (Static Random Access Memory) as one of typical semiconductor memory devices is a RAM which does not need refresh operation for holding stored data. A memory cell in an SRAM has a configuration that a flip flop obtained by cross coupling two inverters each made of a load element and a driver transistor is connected to a pair bit lines via access transistors.

In a memory cell in an SRAM, potential states of two storage nodes in a flip flop correspond to stored data. For example, when potentials of two storage nodes correspond to an H logical high) level and an L (logical low) level, the state corresponds to storage data of "1" and the other state corresponds to storage data of "0". Data on the cross-coupled storage nodes is in a bi-stable state which is maintained as long as a power source voltage is supplied.

When data is written in a memory cell in an SRAM, complementary voltages are applied to a pair of bit lines in correspondence with write data, a word line is made active, and access transistors are turned on, thereby setting a state of a flip flop. On the other hand, data is read by activating a word line, turning on access transistors, transmitting the potentials of the two storage nodes to the pair of bit lines, and detecting a potential change in the bit line pair.

The SRAM also has a bit line precharge circuit for precharging a bit line pair. The bit line precharge circuit is constructed by an N-channel MOS transistor, and precharges a bit line pair to the potential of power source voltage Vcc-Vth during the period in which the precharge instruction is received. Vth denotes a threshold voltage of an N-channel MOS transistor as a component of the bit line precharge circuit.

Hitherto, in order to prevent storage data from being destroyed at the time of reading operation, a memory cell in an SRAM is designed so that a current drivability ratio (also called "cell ratio" or "$\beta$ ratio") between a driver transistor and an access transistor becomes 2.5 to 3 or higher. The cell ratio is set for the reason that when a word line is activated at the time of reading data, electric charges are supplied from a bit line to a storage node in a ground potential. If a driver transistor cannot discharge the supplied electric charges with a sufficient drive power, the potential of the storage node increases due to the supplied electric charges. Therefore, when the other driver transistor is turned on, the stored data is destroyed.

Consequently, the gate width of the driver transistor has to be larger than that of an access transistor in an SRAM. It increases the size of the memory cell in an SRAM.

Japanese Patent Laying-Open No. 63-128662 discloses an SRAM in which the cell ratio can be set to 1 or around 1 (hereinafter, also referred to as "ratioless"), thereby realizing reduction in the area of a memory cell. The SRAM has a flip flop type sense amplifier connected to a bit line pair. The sense amplifier is activated in a short period between time when stored data is read onto a bit line pair after a data reading operation is started and time when the stored data is destroyed due to the ratioless configuration, amplifies the read data, and writes the amplified data again into the memory cell. In such a manner, the SRAM in which stored data is not destroyed even when the ratioless configuration is employed is realized.

In the SRAM, although there is a problem such that the size of a memory cell increases, from the viewpoint of improvement in reading speed, the current drivability of the driver transistor is preferred to be higher. However, when the current drivability of the driver transistor is increased too much, impedance when the driver transistor is conductive becomes too low and a problem such that data cannot be written occurs. On the contrary, when the current drivability of the driver transistor is lowered so that data is easily written, as described above, stored data is destroyed at the time of reading operation.

An SRAM solving such a problem is disclosed in Japanese Patent Laying-Open No. 62-257698. In the SRAM, a capacitor is connected between the drain of a driver transistor and a predetermined potential. With the configuration, reading speed of stored data can be improved by using a discharge state of the capacitor and stored data can be prevented from being destroyed in a reading operation by electric charges accumulated in the capacitor.

In recent years, as IT (Information Technology) dramatically develops, reduction in size and improvement in performance of various electron devices is in increasing demand. A semiconductor memory device mounted on an electron device is also requested to satisfy both higher packing density and higher performance (higher processing speed and lower power consumption).

It can be said that the SRAM disclosed in Japanese Patent Laying-Open No. 63-128662 realizes the ratioless configuration and is adapted to realize higher packing density. However, the reading operation in the SRAM is destructive reading that data stored in a memory cell is once destroyed. In a reading operation, an operation of writing storage data again into a memory cell from the outside of the memory cell is necessary. The rewriting operation has to be executed on all of memory cells connected to a word line activated. Consequently, in the SRAM, further increase in processing speed and further reduction in power consumption cannot be realized.

For the past several years, with the background of improvement in portability and energy saving of an electronic device, particularly, the needs for lower power consumption in a semiconductor memory device are increasing. Since the power consumption is proportional to the square of a power source voltage, to realize lower power consumption, it is most effective to lower the power source voltage. Therefore, a semiconductor memory device newly to be proposed is naturally expected to be used with a lower voltage and is requested to achieve high performance even with a lower voltage.

Conventional SRAMs including SRAMs disclosed in Japanese Patent Laying-Open No. 63-128662 and Japanese Patent Laying-Open No. 62-257698 cannot sufficiently deal with a lower voltage. Specifically, for example, when an external power source voltage is 1.8 V and the threshold voltage of an access transistor and a driver transistor constructing a memory cell is 1.0 V, in a conventional SRAM, the potential of a storage node of the memory cell can be increased only to 0.8 V at the maximum and the driver transistor cannot be turned on.

Although it can be considered to decrease the threshold voltage of the transistor, if the threshold voltage is decreased, a leak current in an OFF state increases and power consumption in a standby mode increases. Therefore, a conventional SRAM cannot sufficiently deal with lower power consumption.

Further, although the SRAM disclosed in Japanese Patent Laying-Open No. 62-257698 can realize improvement in reading speed and prevention of destructive reading, a capacitor provided has to be charged/discharged for a writing operation. Consequently, time required for the writing operation increases by the amount. As the voltage is decreasing, time required for charging/discharging the capacity increases, so that it becomes difficult to realize higher processing speed of the semiconductor memory device.

SUMMARY OF THE INVENTION

The present invention has been achieved to solve the problems, and its object is to provide a semiconductor memory device realizing higher packing density by reducing the area of a memory cell by realizing a ratioless configuration, and operating stably at high speed with a lower voltage.

According to the present invention, a semiconductor memory device includes: a memory cell storing data; a word line connected to the memory cell; a pair of bit lines connected to the memory cell and each having a first capacitance value; a bit line precharge circuit precharging the pair of bit lines to a power source potential; a boosted voltage generating circuit generating a voltage of a first potential higher than the power source power source potential; and a word line activating circuit receiving the voltage of the first potential from the boosted voltage generating circuit and activating the word line with the voltage of the first potential. The memory cell includes: first and second inverters each of which has a load element and a drive element and which are cross-coupled; a first storage node connected to an output node of the first inverter and an input node of the second inverter and having a second capacitance value which is equal to or larger than $\frac{1}{8}$ of the first capacitance value; a second storage node connected to an output node of the second inverter and an input node of the first inverter and having the second capacitance value, and first and second gate elements connecting the first and second storage nodes to one bit line in the pair of bit lines and the other bit line, respectively. Current drivability of the drive element is lower than twice of current drivability of the first and second gate elements.

According to the present invention, there is also provided a semiconductor memory device including: a memory cell array including a plurality of memory cells arranged in a matrix for storing data; a plurality of word lines arranged in correspondence with rows of the memory cell array; a plurality of bit line pairs arranged in correspondence with columns of the memory cell array, each bit line having a first capacitance value; a plurality of bit line precharge circuits each precharging a corresponding pair of bit lines to a power source potential; a boosted voltage generating circuit generating a voltage of a predetermined potential higher than the power source potential; and a plurality of word line activating circuits each receiving the voltage of the predetermined potential from the boosted voltage generating circuit and activating a corresponding word line with the voltage of the predetermined potential. Each of the plurality of memory cells includes: first and second inverters each of which has a load element and a drive element and which are cross-coupled; a first storage node connected to an output node of the first inverter and an input node of the second inverter and having a second capacitance value which is equal to or larger than $\frac{1}{8}$ of the first capacitance value; a second storage node connected to an output node of the second inverter and an input node of the first inverter and having the second capacitance value; and first and second gate elements connecting the first and second storage nodes to one bit line in the corresponding pair of bit lines and the other bit line, respectively. Current drivability of the drive element is lower than twice of current drivability of the first and second gate elements and when any of the plurality of word lines is activated, the bit line precharge circuit corresponding to the pair of bit lines which perpendicularly cross the activated word line is made inactive.

By the semiconductor memory device according to the present invention, the capacitance value of a storage node included in a memory cell is assured, a memory cell has the ratioless configuration, and the quantity of charges supplied from a bit line pair to a storage node at the time of reading/writing data is sufficiently assured. Thus, the area of the memory cell is reduced, thereby realizing higher packing density, and stable and high-speed operation with a low voltage is realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the present invention will be described in detail with reference to the drawings. The same or corresponding parts are designated by the same reference numeral and its description will not be repeated.

First Embodiment

Figure 1:
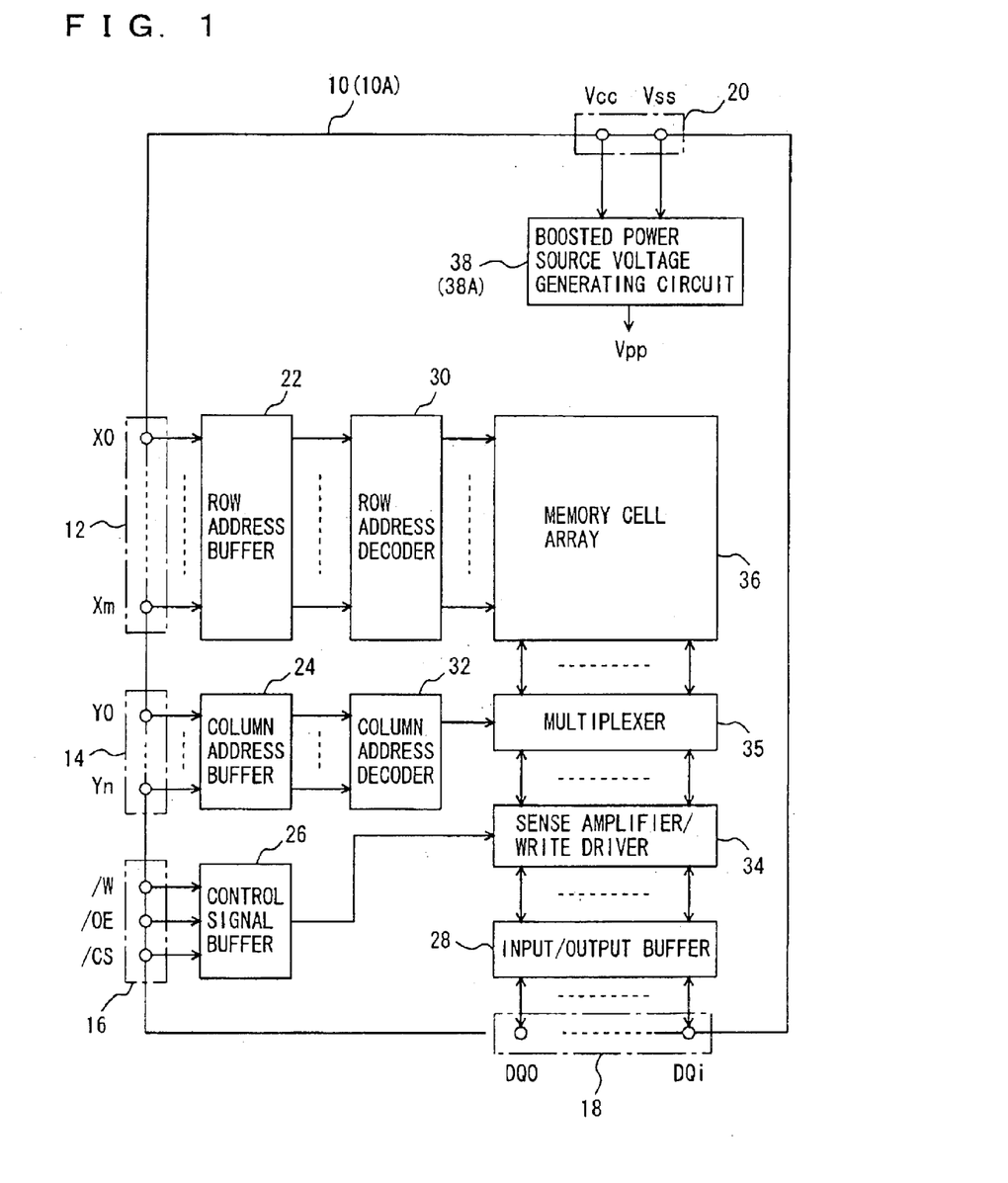
FIG. 1 is a general block diagram conceptually showing the configuration of a semiconductor memory device according to a first embodiment of the present invention.

FIG. 1 is a general block diagram conceptually showing the configuration of a semiconductor memory device 10 according to a first embodiment of the present invention.

Referring to FIG. 1, semiconductor memory device 10 has a row address terminal 12, a column address terminal 14, a control signal terminal 16, a data input/output terminal 18, and a power source terminal 20. Semiconductor memory device 10 also has a row address buffer 22, a column address buffer 24, a control signal buffer 26, and an input/output buffer 28. Further, semiconductor memory device 10 has a row address decoder 30, a column address decoder 32, a sense amplifier/write driver 34, a multiplexer 35, a memory cell array 36, and a boosted power source voltage generating circuit 38.

Row address terminal 12 and column address terminal 14 receive row address signals X0 to Xm and column address signals Y0 to Yn (m and n: natural numbers), respectively. Control signal terminal 16 receives a write control signal /W, an output enable signal /OE, and a chip select signal /CS.

Row address buffer 22 receives row address signals X0 to Xm, generates an internal row address signal and outputs it to row address decoder 30. Column address buffer 24 receives column address signals Y0 to Yn, generates an internal column address signal, and outputs it to column address decoder 32. Control signal buffer 26 receives write control signal /W, output enable signal /OE, and chip select signal /CS, and outputs a write enable signal WE and an output enable signal OE to sense amplifier/write driver 34.

Data input/output terminal 18 is a terminal for transmitting/receiving data to be read/written in semiconductor memory device 10 to/from the outside, receives data DQ0 to DQi (i: natural number) supplied from the outside at the time of data writing, and outputs data DQ0 to DQi to the outside at the time of data reading.

At the time of data writing, input/output buffer 28 receives and latches data DQ0 to DQi and outputs internal data IDQ0 to IDQi to sense amplifier/write driver 34. On the other hand, at the time of data reading, input/output buffer 28 outputs internal data IDQ0 to IDQi received from sense amplifier/write driver 34 to data input/output terminal 18.

Power source terminal 20 receives a power source voltage Vcc and a ground voltage Vss from the outside. Boosted power source voltage generating circuit 38 receives power source voltage Vcc and ground voltage Vss from power source terminal 20, generates a voltage Vpp (Vpp>power source voltage Vcc+Vthn), and outputs generated voltage Vpp to a word line driver included in row address decoder 30. Voltage Vthn is a threshold voltage of an N-channel MOS transistor as a component of a memory cell included in memory cell array 36. Boosted power source voltage generating circuit 38 is a component of a "boosted voltage generating circuit".

Row address decoder 30 selects a word line on memory cell array 36 corresponding to row address signals X0 to Xm and activates the selected word line by a not-shown word line driver with voltage Vpp. Column address decoder 32 outputs a column selection signal for selecting a bit line pair on memory cell array 36 corresponding to column address signals Y0 to Yn to multiplexer 35.

At the time of data writing, sense amplifier/write driver 34 receives write enable signal WE from control signal buffer 26, according to the logic level of internal data IDQ0 to IDQi received from input/output buffer 28, applies power source voltage Vcc to one of I/O lines of a pair corresponding to each internal data, and applies ground voltage GND to the other I/O line. At the time of data reading, sense amplifier/write driver 34 receives output enable signal OE from control signal buffer 26, detects and amplifies a small voltage change which occurs in the I/O line pair in correspondence with read data, determines the logic level of the read data, and outputs the read data to input/output buffer 28.

Multiplexer 35 connects the I/O line pair to a selected bit line pair in accordance with a column selection signal received from column address decoder 32.

Memory cell array 36 is a memory element group in which memory cells are arranged in a matrix, is connected to row address decoder 30 via a word line corresponding to each row and is connected to multiplexer 35 via a bit line pair corresponding to each column.

In semiconductor memory device 10, at the time of data writing, a word line according to row address signals X0 to Xm is activated with voltage Vpp by row address decoder 30. A bit line pair according to column address signals Y0 to Yn is selected by column address decoder 32 and connected to the I/O line pair by multiplexer 35. Sense amplifier/write driver 34 writes internal data IDQ0 to IDQi received from input/output buffer 28 into the I/O line pair, thereby writing internal data IDQ0 to IDQi into a memory cell selected by row address signals X0 to Xm and column address signals Y0 to Yn.

On the other hand, at the time of data reading, each bit line pair is precharged to power source potential Vcc by a not-shown bit line precharge circuit. After that, a bit line pair according to column address signals Y0 to Yn is selected by column address decoder 32, and selected bit line pair is connected to the I/O line pair by multiplexer 35. When a word line according to row address signals X0 to Xm is activated with voltage Vpp by row address decoder 30, data is read from the selected memory cell to the bit line pair and the I/O line pair.

Sense amplifier/write driver 34 detects and amplifies a small voltage change which occurs in the I/O line pair in correspondence with read data and outputs read data to input/output buffer 28. By the operation, internal data IDQ0 to IDQi is read from a memory cell selected by row address signals X0 to Xm and column address signals Y0 to Yn.

Figure 2:
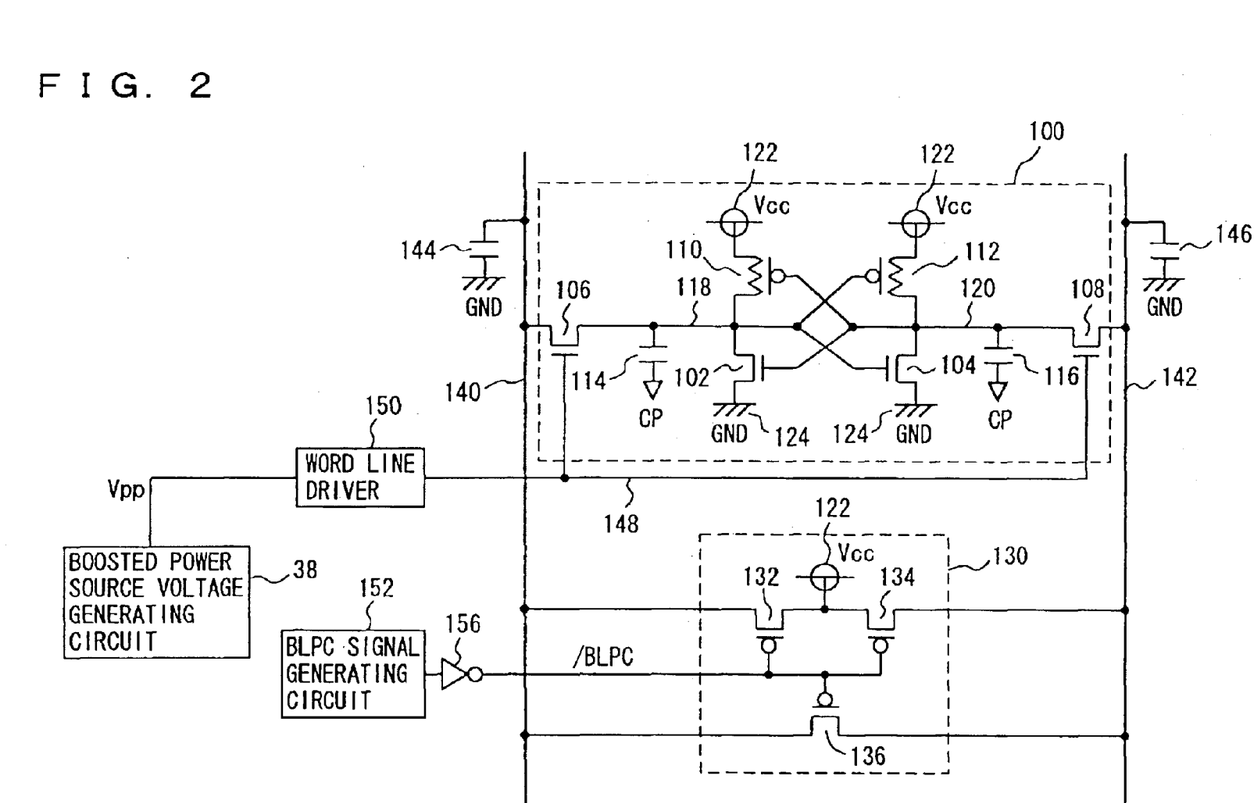
FIG. 2 is a circuit diagram showing the configuration of one of memory cells arranged in a matrix in a memory cell array and its peripheral circuits in the semiconductor memory device according to the first embodiment.

FIG. 2 is a circuit diagram showing the configuration of one of memory cells arranged in a matrix in memory cell array 36 and its peripheral circuits in semiconductor memory device 10 according to the first embodiment.

Referring to FIG. 2, for memory cell array 36, a pair of bit lines 140 and 142 and a word line 148 are disposed so as to perpendicularly cross each other, and a memory cell 100 is connected to the pair of bit lines 140 and 142 and word line 148. To the pair of bit lines 140 and 142, a bit line precharge circuit 130 is connected.

A word line driver 150 receives voltage Vpp obtained by boosting power source voltage Vcc from boosted power source voltage generating circuit 38 and, when word line 148 is selected by not-shown row address decoder 30, activates word line 148 with voltage Vpp. On the other hand, when word line 148 is not selected, word line driver 150 inactivates word line 148 with ground voltage GND. Word line driver 150 serves as a "word line activate circuit".

In a period in which word line 148 is inactive or just before word line 148 is activated, a BLPC signal generating circuit 152 outputs a bit line precharge signal BLPC at the H level. An inverter 156 receives bit line precharge signal BLPC and outputs an inversion signal/BLPC of bit line precharge signal BLPC to bit line precharge circuit 130.

Bit line precharge circuit 130 includes P-channel MOS transistors 132, 134, and 136 and a power source node 122. P-channel MOS transistor 132 is connected between power source node 122 and bit line 140 and receives a signal/BLPC by its gate. P-channel MOS transistor 134 is connected between power source node 122 and bit line 142 and receives signal/BLPC by its gate. P-channel MOS transistor 136 is connected between bit lines 140 and 142 and receives signal/BLPC by its gate.

During signal/BLPC is at the L level, that is, during bit line precharge signal BLPC is at the H level, bit line precharge circuit 130 precharges the pair of bit lines 140 and 142 to power source potential Vcc.

Memory cell 100 includes N-channel MOS transistors 102, 104, 106, and 108, P-channel thin-film transistors (hereinafter, thin film transistor will be also abbreviated as "TFT") 110 and 112, storage nodes 118 and 120, capacitors 114 and 116, the power source node 122, and a ground node 124.

P-channel TFTs 110 and 112 are resistive elements made of polysilicon and having a switching function and are high-resistive elements having an OFF-state resistance on the order of T (tera, "T" indicates $10^{12}$) Ω and an ON-state resistance on the order of G (giga, "G" indicates $10^9$) Ω.

P-channel TFT 110 is connected between power source node 122 and storage node 118 and its gate is connected to storage node 120. P-channel TFT 112 is connected between power source node 122 and storage node 120 and its gate is connected to storage node 118. N-channel MOS transistor 102 is connected between storage node 118 and ground node 124 and its gate is connected to storage node 120. N-channel MOS transistor 104 is connected between storage node 120 and ground node 124 and its gate is connected to storage node 118.

P-channel TFTs 110 and 112 made of polysilicon are formed in the upper layer of bulk N-channel MOS transistors 102 and 104 formed in a substrate, so that it contributes to reduction in size of a memory cell.

P-channel TFT 110 and N-channel MOS transistor 102 form an inverter and P-channel TFT 112 and N-channel MOS transistor 104 form an inverter. By cross-coupling the inverters, a flip flop is formed. With the configuration, complementary data is latched in a bi-stable state in storage nodes 118 and 120 and data is stored in memory cell 100.

N-channel MOS transistor 106 is connected between storage node 118 and bit line 140 and its gate is connected to word line 148. N-channel MOS transistor 108 is connected between bit line 142 complementary to bit line 140 and storage node 120 and its gate is connected to word line 148.

N-channel MOS transistors 106 and 108 serve as gate elements (hereinafter, also referred to as "access transistors") for connecting memory cell 100 to the pair of bit lines 140 and 142 when word line 148 is activated. On the other hand, N-channel MOS transistor 102 and 104 serve as drive elements (hereinafter, also referred to as "driver transistors") for discharging storage nodes 118 and 120.

The cell ratio between N-channel MOS transistors 102 and 104 as driver transistors and N-channel MOS transistors 106 and 108 as access transistors is 1, and each of the N-channel MOS transistors has the minimum gate width and the minimum gate length which are permissible from the viewpoint of manufacture.

Capacitor 114 is connected between storage node 118 and a cell plate CP of a constant potential. Capacitor 116 is connected between storage node 120 and cell plate CP. Capacitors 114 and 116 are formed on the substrate, so that the area of memory cell 100 is not increased by providing capacitors 114 and 116.

Capacitors 144 and 146 indicate parasitic capacitance of bit lines 140 and 142, respectively.

The operation of memory cell 100 will be described hereinafter.

(1) Reading Operation

The reading operation in the case where data "1" is written in memory cell 100, that is, in the case where potentials of storage nodes 118 and 120 are potentials corresponding to the "H level" and "L level", respectively will be described.

Prior to the reading operation, BLPC signal generating circuit 152 outputs bit line precharge signal BLPC at the H level to active bit line precharge circuit 130, and bit line precharge circuit 130 precharges bit lines 140 and 142 to power source potential Vcc. By the time word line 148 is activated with voltage Vpp by word line driver 150, BLPC signal generating circuit 152 sets bit line precharge signal BLPC to the L level and bit line precharge circuit 130 is made inactive.

After that, when word line 148 is activated with voltage Vpp and N-channel MOS transistors 106 and 108 are turned on, according to potentials of storage nodes 118 and 120, the potentials of bit lines 140 and 142 change. By detecting the change by a not-shown sense amplifier, data stored in memory cell 100 is read.

Figure 3:
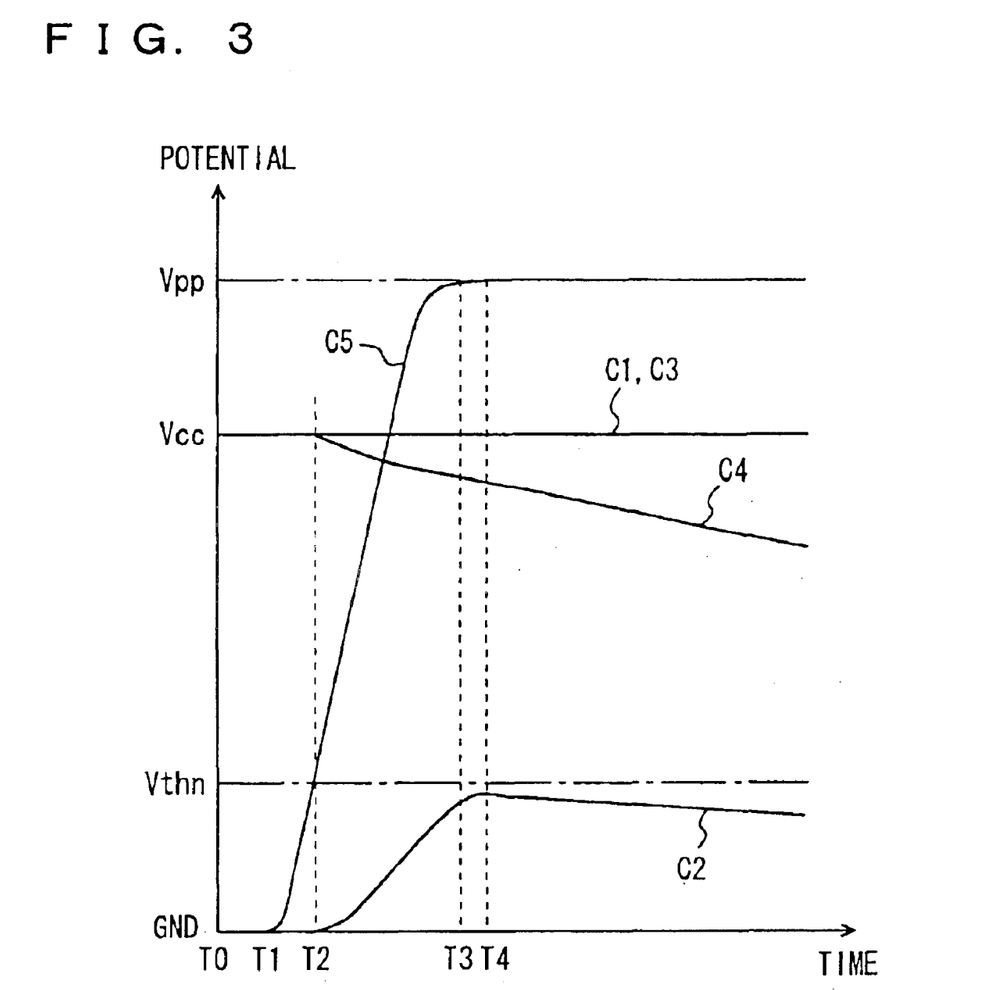
FIG. 3 is a diagram showing potential changes in a storage node, a bit line pair, and a word line at the time of reading data.

FIG. 3 is a diagram showing potential changes in storage nodes 118 and 120, the pair of bit lines 140 and 142, and word line 148 at the time of data reading.

Referring to FIG. 3, the vertical and horizontal axes indicate potential and elapsed time, respectively. Curves C1 and C2 indicate potential changes in storage nodes 118 and 120, respectively, curves C3 and C4 indicate potential changes in bit lines 140 and 142, respectively, and a curve C5 indicates a potential change in word line 148.

At time T0 before the reading operation starts, the potentials of storage nodes 118 and 120 are power source potential Vcc and ground potential GND, respectively. Bit lines 140 and 142 are precharged to power source potential Vcc by bit line precharge circuit 130. The potential of word line 148 is ground potential GND.

When word line 148 is activated at time T1, the potential of word line 148 starts increasing. When the potential of word line 148 exceeds threshold voltage Vthn of N-channel MOS transistors 106 and 108 at time T2, N-channel MOS transistors 106 and 108 are turned on. Electric charges are supplied from bit line 142 to storage node 120 and capacitor 116 connected to storage node 120 via N-channel MOS transistor 108, the potential of storage node 120 starts increasing and the potential of bit line 142 starts decreasing.

At time T3, the potential of word line 148 reaches Vpp. At time T4 just after time T3, the potential of storage node 120 becomes the highest. Since electric charges supplied from bit line 142 to storage node 120 are discharged via N-channel MOS transistor 104, at time T4 or later, the potential of bit line 142 decreases and, accordingly, the potential of storage node 120 decreases.

The cell ratio of memory cell 100 is 1, the current drivability of N-channel MOS transistor 104 as a driver transistor is insufficient. However, electric charges which are not discharged by N-channel MOS transistor 104 and cause rise in the potential of storage node 120 are absorbed by capacitor 116 connected to storage node 120. Consequently, the rise in the potential of storage node 120 is suppressed in a range lower than threshold voltage Vthn.

If capacitor 116 is not provided and the capacitance of storage node 120 itself is small, the potential of storage node 120 exceeds threshold voltage Vthn of N-channel MOS transistor 102. In this case, N-channel MOS transistor 102 is turned on and the potential of storage node 118 decreases. Accordingly, N-channel MOS transistor 104 is turned off and storage data is inverted. That is, stored data is destroyed.

The capacitance of capacitor 116 is properly determined so that the potential of storage node 120 does not exceed threshold voltage Vthn of N-channel MOS transistor 102.

Figure 4:
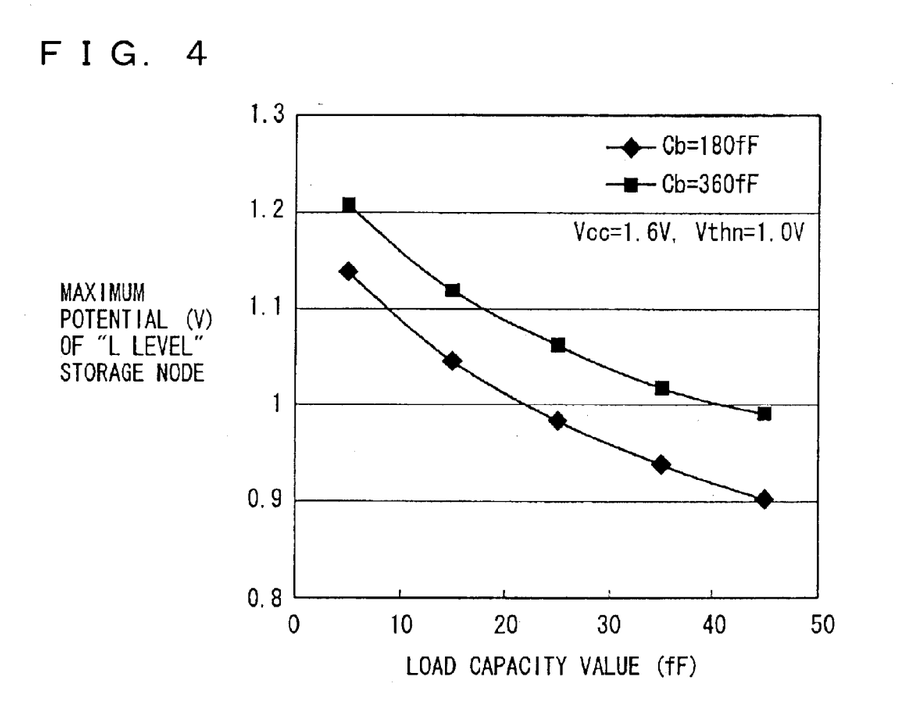
FIG. 4 is a diagram showing dependency on a capacitance value of a capacitor of the maximum potential of a storage node in the reading operation in the memory cell illustrated in FIG. 2.

FIG. 4 is a diagram showing dependency of the maximum potential of storage node 120 on the capacitance value of capacitor 116 in a reading operation in memory cell 100 illustrated in FIG. 2.

Referring to FIG. 4, the horizontal and vertical axes show the capacitance value of capacitor 116 and the maximum potential of storage node 120. A curve obtained by plotting rhombus signs indicates the case where the parasitic capacitance of bit line 142 is 180 fF. A curve obtained by plotting square signs indicates the case where the parasitic capacitance of bit line 142 is 360 fF. In the first embodiment, power source voltage Vcc is 1.6 V and threshold voltage Vthn of N-channel MOS transistor 102 is about 1.0 V.

The maximum potential of storage node 120 becomes 1.0 V at about 23 fF when the parasitic capacitance of bit line 142 is 180 fF and at about 43 fF when the parasitic capacitance of bit line 142 is 360 fF. Therefore, for example, when the parasitic capacitance of bit line 142 is 180 fF, by providing capacitor 116 of which capacitance value is larger than 23 fF, the potential of storage node 120 does not exceed 1.0 V as the threshold voltage of N-channel MOS transistor 102. Even when the cell ratio of memory cell 100 is 1, stored data is not inverted and can be read without being destroyed.

When the maximum permissible potential of storage node 120 is 1.0 V, the ratio between the parasitic capacitance of bit line 142 and the capacitance of capacitor 116 (hereinafter, also simply referred to as "capacitance ratio") is about 7.8 when the parasitic capacitance of bit line 142 is 180 fF and is about 8.3 when the parasitic capacitance of bit line 142 is 360 fF. Usually, the capacitance ratio between a bit line and a memory cell in a DRAM is about 3. The above-described values are larger than the value of the DRAM.

In the above-mentioned example, the maximum potential of storage node 120 is 1.0 V. In the trend of lowering the power source voltage, it is desirable to lower the threshold voltage of N-channel MOS transistor 102 (N-channel MOS transistor 104 as well). Therefore, it is desirable to also decrease the maximum potential of storage node 120. When the maximum potential of storage node 120 is lower than 1.0 V, as understood from FIG. 4, the capacitance ratio has to be decreased. In order to suppress an increase in the potential of storage node 120, it is desirable to set the capacitance ratio to at least 8 or less in consideration of the above-mentioned data. Unlike a DRAM, memory cell 100 has a latch circuit for holding data, so that the capacitance ratio does not have to be lower than the value of the DRAM. Therefore, it is considered to be desirable to set the capacitance ratio within a range from 3 to 8.

As described above, in memory cell 100, the capacitance ratio can be set higher as compared with a DRAM, and the permissible range of the capacitance ratio becomes wider as compared with a DRAM. Therefore, as compared with a DRAM, a number of memory cells can be connected to a pair of bit lines and the length of a pair of bit lines can be increased. Thus, flexibility of designing is improved.

When the capacitance value of capacitor 116 is too large, charging time of storage node 120 and capacitor 116 becomes long at the time of data writing, so that the speed of the writing operation becomes low. Therefore, the capacitance value of capacitor 116 has to be properly determined to a value including a margin in which operation is assured by using the capacitance value described in FIG. 4 as a reference in consideration of fluctuations in electric charges supplied to storage node 120 due to fluctuations in the power source voltage or the like.

In the first embodiment, as described above, the pair of bit lines 140 and 142 is precharged to power source potential Vcc by bit line precharge circuit 130 constructed by P-channel MOS transistors. The reason why the pair of bit lines 140 and 142 is precharged to power source potential Vcc (not power source potential Vcc-Vthn) is as follows.

As described above, threshold voltage Vthn of N-channel MOS transistors 102 to 108 is about 1.0 V. When semiconductor memory device 10 is used with a low voltage, that is, for example, when power source voltage Vcc is 1.6 V, if the precharge potential of the pair of bit lines 140 and 142 is power source potential Vcc-Vthn, that is, 0.6 V like a conventional SRAM, the potential of storage node 118 at the H level decreases from 1.6 V to 0.6 V accompanying the reading operation. Therefore, N-channel MOS transistor 104 is turned off, so that memory cell 100 operates erroneously.

Bit line precharge circuit 130 is constructed by P-channel MOS transistors so as not to decrease threshold voltage Vthn from power source potential Vcc of power source node 122. With the configuration, the pair of bit lines 140 and 142 is precharged to power source potential Vcc supplied from power source node 122.

Although the case where data "1" is stored in memory cell 100 has been described above, the case where data "0" is stored can be considered similarly.

(2) Writing Operation

The case of writing data "1" in memory cell 100, that is, the case of setting the potentials of storage nodes 118 and 120 to potentials corresponding to the "H level" and "L level", respectively will be described.

Referring again to FIG. 2, in a state where word line 148 is activated with voltage Vpp by word line driver 150 and N-channel MOS transistors 106 and 108 are turned on, when power source voltage Vcc and ground voltage GND are applied to bit lines 140 and 142, respectively, by not-shown sense amplifier/write driver 34, electric charges are supplied from bit line 140 to storage node 118 and capacitor 114 via N-channel MOS transistor 106. On the other hand, electric charges are discharged from storage node 120 and capacitor 116 via N-channel MOS transistor 108 to bit line 142, and the state of the flip flop constructed by P-channel TFTs 110 and 112 and N-channel MOS transistors 102 and 104 is set.

The reason why word line 148 is activated with voltage Vpp higher than a potential which is higher than power source potential Vcc by the amount of threshold voltage Vthn of N-channel MOS transistors 106 and 108 is as follows.

When semiconductor memory device 10 is used with a low voltage, that is, when power source voltage Vcc is 1.6 V, if the potential of activated word line 148 is power source potential Vcc, since threshold voltage Vthn of N-channel MOS transistors 102 to 108 is about 1.0 V, the potential of storage node 118 does not rise up to 0.6 V. Therefore, N-channel MOS transistor 104 as a driver transistor is not turned on and the state of the flip flop cannot be set.

Although it can be also considered to decrease threshold voltage Vthn of N-channel MOS transistors 102 to 108, if threshold voltage Vthn is decreased, a leak current when N-channel MOS transistors 102 to 108 are off increases, and power consumption in a standby state increases.

Although it can be also considered to charge storage node 118 with an ON-state current of P-channel TFT 110, since P-channel TFT 110 (also P-channel TFT 112) is formed on the substrate, the ratio of the ON-state current to the OFF-state current cannot be increased. The magnitude of the OFF-state current is determined from a demand for lower power consumption in a standby state, so that the ON-state current cannot be increased.

Specifically, in memory cell 100, the ON-state current and the OFF-state current of P-channel TFTs 110 and 112 are about $1 \times 10^{-11}$ A (ampere) and about $1 \times 10^{-13}$ A, respectively. Since the capacitance of capacitors 114 and 116 is about 25 fF (femtofarad, "f" denotes $10^{-15}$), to set the potential of storage node 118 to 1.0 V as threshold voltage Vthn of N-channel MOS transistor 104 or higher by the ON-state current of P-channel TFT 110, the following time "t" is required.

$$t = \text{electric charge } Q/\text{current } I = (25 \times 10^{-15} \, F) \times (1.0 \, V - 0.6 \, V)/(1 \times 10^{-11} \, A) = 1.0 \times 10^{-3} \text{ seconds} \quad (1)$$

Therefore, to set storage node 118 to 1.0 V or higher by the ON-state current of P-channel TFT 110, time on the order of millisecond (ms) is necessary. It is difficult to increase the potential of storage node 118 to threshold voltage Vthn of N-channel MOS transistor 104 or higher in a short write cycle.

From the above, it is necessary to activate word line 148 with increased voltage Vpp (Vpp>Vcc+Vthn) and to set storage node 118 to power source potential Vcc only by supply of electric charges from bit line 140.

Since the current drivability of N-channel MOS transistors 106 and 108 can be enhanced by increasing the voltage of word line 148 as described above, increase in time of charging/discharging storage nodes 118 and 120 due to addition of capacitors 114 and 116 is suppressed. Irrespective of the current drivability of P-channel TFTs 110 and 112, memory cell 100 operates stably at high speed.

Although the case of writing the data "1" in memory cell 100 has been described above, the case of writing data "0" can be considered similarly.

Figure 5:
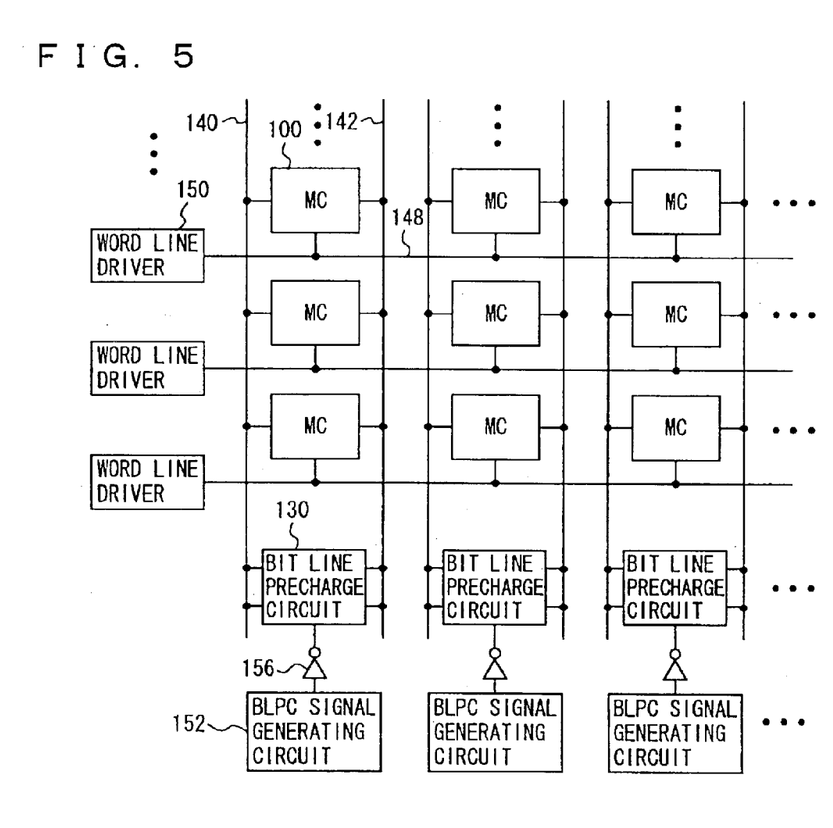
FIG. 5 is a diagram showing an array arrangement of memory cells in the memory cell array illustrated in FIG. 1.

FIG. 5 is a diagram showing array arrangement of memory cell 100 in memory cell array 36 illustrated in FIG. 1.

Referring to FIG. 5, in memory cell array 36, memory cells 100 shown in FIG. 2 are arranged in a matrix. Memory cells 100 are connected to word lines 148 and the pairs of bit lines 140 and 142 arranged in rows and columns. In correspondence with each word line 148, word line driver 150 for activating the word line is provided. In correspondence with the pair of bit lines 140 and 142, bit line precharge circuit 130 for precharging the bit line pair to the power source potential is provided. In correspondence with each bit line precharge circuit 130, BLPC signal generating circuit 152 is provided.

In memory cell array 36, bit line precharge circuit 130 corresponding to the pair of bit lines 140 and 142 connected to not-selected memory cell 100 connected to activated word line 148 is made inactive for the period in which word line 148 is made active. Specifically, when word line 148 is activated in association with the operation of reading data from selected memory cell 100, N-channel MOS transistors 106 and 108 as access transistors are turned on also in unselected memory cells connected to activated word line 148. At this time, all of bit line precharge circuits 130 are made inactive.

Therefore, the pair of bit lines 140 and 142 corresponding to the unselected memory cells remains in the same state as that in the normal data reading operation. In an unselected memory cell, even when word line 148 is activated and the access transistor is turned on, storage data is not destroyed as described in the explanation of the reading operation. Thus, memory cell array 36 in which memory cells 100 are arranged in an array is realized.

Figure 6:
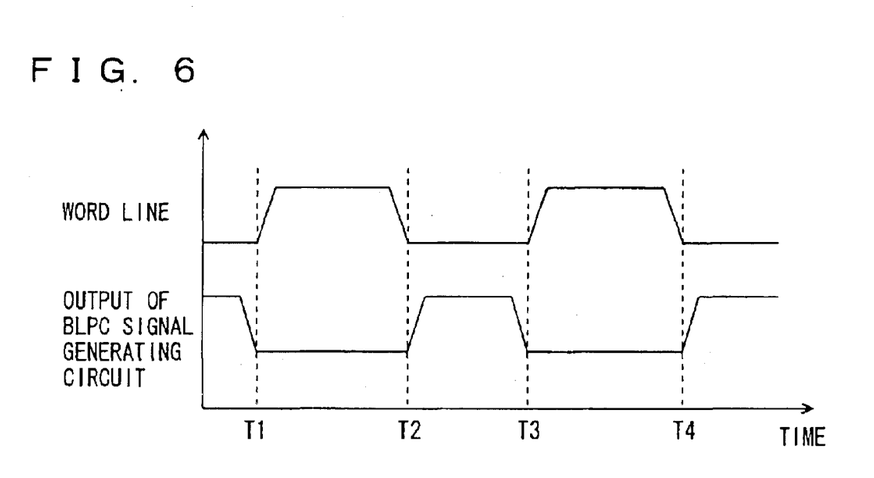
FIG. 6 is a timing chart for describing an active state of a bit line precharge circuit illustrated in FIG. 5.

FIG. 6 is a timing chart for describing an active state of bit line precharge circuit 152 shown in FIG. 5.

Referring to FIG. 6, before time T1, in period from time T2 to time T3, and after time T4 when word line 148 is inactive, BLPC signal generating circuit 152 outputs bit line precharge signal BLPC at the H level. Therefore, bit line precharge circuit 130 is activated during the periods to precharge corresponding bit lines 140 and 142 to the power source potential.

In period from time T1 to T2 and period from time T3 to T4 in which word line 148 is active, BLPC signal generating circuit 152 outputs bit line precharge signal BLPC at the L level. Consequently, bit line precharge circuit 130 is inactive during the periods and stored data in unselected memory cell 100 which is connected to active word line 148 is not destroyed.

Although the case where memory cell array 36 is divided into blocks is not mentioned in the example, when memory cell array 36 is divided into a plurality of blocks, it is sufficient to make bit line precharge circuit 130 inactive during the periods in a block including at least activated word line 148.

As described above, according to semiconductor memory device 10 of the first embodiment, capacitors 114 and 116 connected to storage nodes 118 and 120 are provided, the pair of bit lines 140 and 142 is precharged by bit line precharge circuit 130 to power source potential Vcc, and word line 148 is activated with voltage Vpp. Consequently, the ratioless configuration of memory cell 100 is achieved, the cell area is reduced and, therefore, the device area can be reduced.

Memory cell 100 operates stably even with a low voltage, so that lower power consumption of semiconductor memory device 10 can be realized. Further, data in memory cell 100 can be read nondestructively, so that a rewriting operation is unnecessary. Thus, higher-speed operation of semiconductor memory device 10 can be realized.

Second Embodiment

In a second embodiment, a bit line precharge circuit is constructed by N-channel MOS transistors.

Referring again to FIG. 1, a semiconductor memory device 10A according to a second embodiment has a configuration similar to that of semiconductor memory device 10 according to the first embodiment except that a boosted power source voltage generating circuit 38A is provided in place of boosted power source voltage generating circuit 38. Boosted power source voltage generating circuit 38A is different from boosted power source voltage generating circuit 38 with respect to the points that it outputs generated voltage Vpp to a word line driver included in row address decoder 30 and also to a not-shown BLPC signal generating circuit.

Since the other configuration of semiconductor memory device 10A is the same as that of semiconductor memory device 10, its description will not be repeated.

Figure 7:
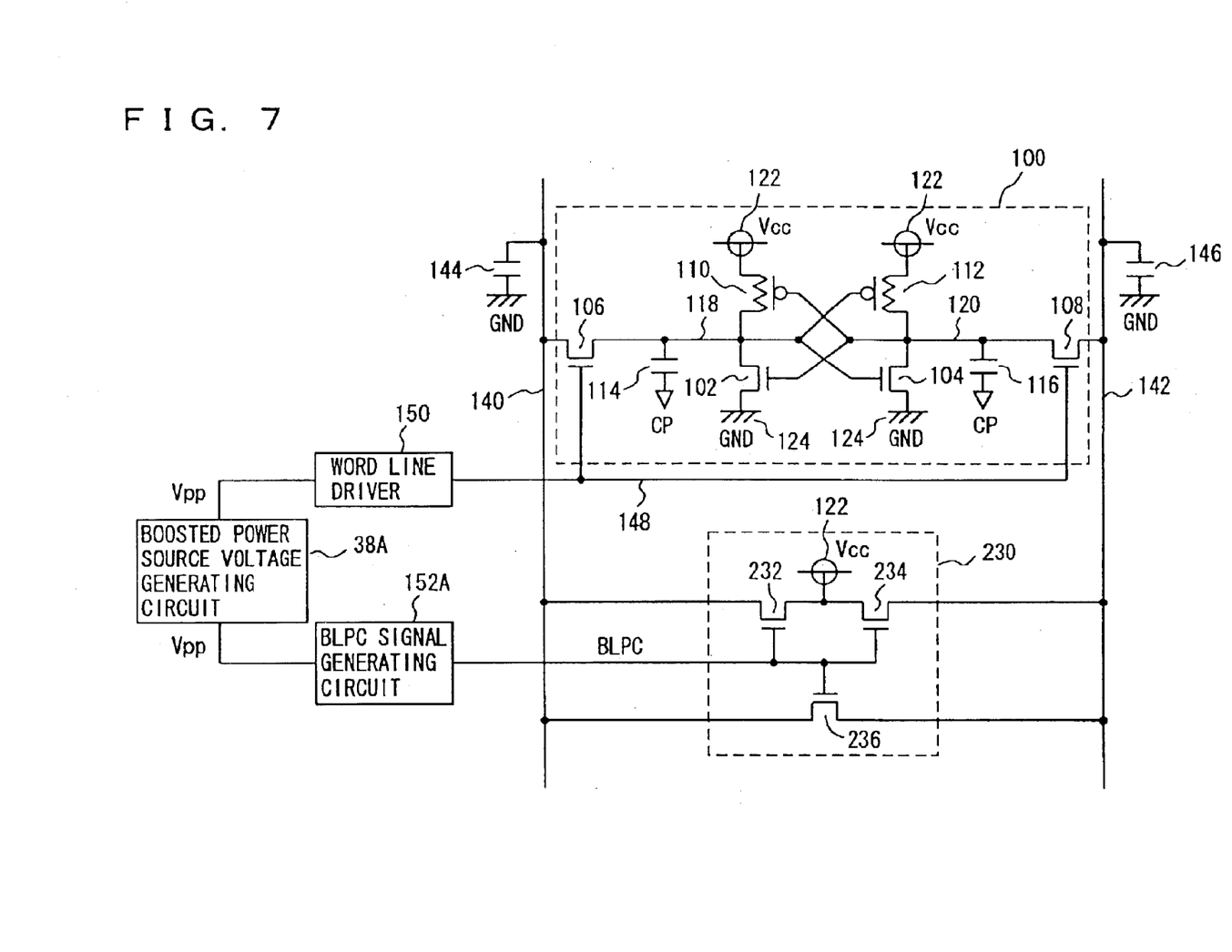
FIG. 7 is a circuit diagram showing the configuration of one of memory cells arranged in a matrix in a memory cell array and its peripheral circuits in a semiconductor memory device according to a second embodiment.

FIG. 7 is a circuit diagram showing the configuration of one of memory cells arranged in a matrix in memory cell array 36 and its peripheral circuits in semiconductor memory device 10A according to the second embodiment.

Referring to FIG. 7, a BLPC signal generating circuit 152A receives voltage Vpp obtained by increasing power source voltage Vcc from boosted power source voltage generating circuit 38A and, during a period in which word line 148 is inactive or just before word line 148 is made active, outputs bit line precharge signal BLPC of the H level of voltage Vpp to a bit line precharge circuit 230.

Bit line precharge circuit 230 includes N-channel MOS transistors 232, 234, and 236 and power source node 122. N-channel MOS transistor 232 is connected between power source node 122 and bit line 140 and receives bit line precharge signal BLPC by its gate. N-channel MOS transistor 234 is connected between power source node 122 and bit line 142 and receives bit line precharge signal BLPC by its gate. N-channel MOS transistor 236 is connected between bit lines 140 and 142 and receives bit line precharge signal BLPC by its gate.

During bit line precharge signal BLPC is at the H level, that is, during voltage Vpp is received as bit line precharge signal BLPC from BLPC signal generating circuit 152A, bit line precharge circuit 230 precharges the pair of bit lines 140 and 142 to power source potential Vcc.

Since the configuration of the other circuits shown in FIG. 7 is similar to that of the circuits shown in FIG. 2, its description will not be repeated. Since the operations of memory cell 100 and its peripheral circuits in the second embodiment are similar to those of memory cell 100 and its peripheral circuits in the first embodiment, its description will not be repeated.

In semiconductor memory device 10A according to the second embodiment, bit line precharge circuit 230 is constructed by the N-channel MOS transistors of the same conductive type as that of bulk transistors constructing memory cell 100. Consequently, it is unnecessary to newly form an N-type well region around a memory cell, so that the device area is reduced.

Third Embodiment

Figure 8:
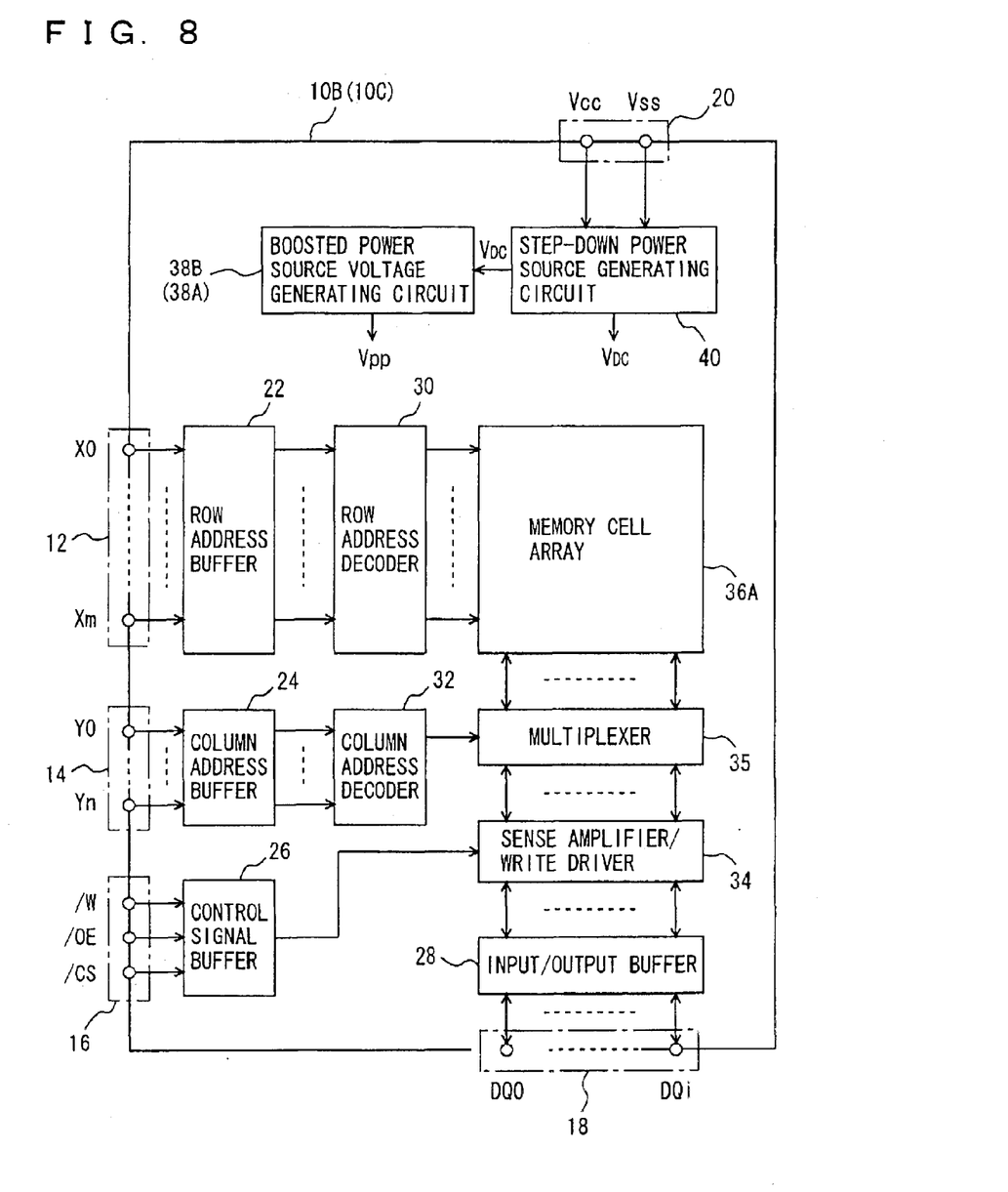
FIG. 8 is a general block diagram conceptually showing the configuration of a semiconductor memory device according to a third embodiment of the present invention.

FIG. 8 is a general block diagram conceptually showing the configuration of a semiconductor memory device 10B according to a third embodiment of the present invention.

Referring to FIG. 8, semiconductor memory device 10B has a configuration similar to that of semiconductor memory device 10 according to the first embodiment shown in FIG. 1 except that a step-down power source generating circuit 40 is further provided and a boosted power source voltage generating circuit 38B and a memory cell array 36A are provided in place of boosted power source voltage generating circuit 38 and memory cell array 36, respectively.

Step-down power source generating circuit 40 receives power source voltage Vcc and ground voltage Vss from power source terminal 20, generates a voltage $V_{DC}$ which is a predetermined potential, and outputs generated voltage $V_{DC}$ to boosted power source voltage generating circuit 38A, a not-shown bit line precharge circuit, and a memory cell included in memory cell array 36A. Step-down power source generating circuit 40 serves as an "internal power source generating circuit".

Boosted power source voltage generating circuit 38B receives voltage $V_{DC}$ from step-down power source generating circuit 40, generates voltage VPP (VPP>$V_{DC}$+Vthn), and outputs generated voltage Vpp to a word line driver included in row address decoder 30.

Memory cell array 36A has the same configuration as that of memory cell array 36 in the first and second embodiments except for the point that a voltage supplied to each of the memory cells included in memory cell array 36A is voltage $V_{DC}$ outputted from step-down power source generating circuit 40.

Since the other configuration of semiconductor memory device 10B is the same as that of semiconductor memory device 10 in the first embodiment, its description will not be repeated.

Figure 9:
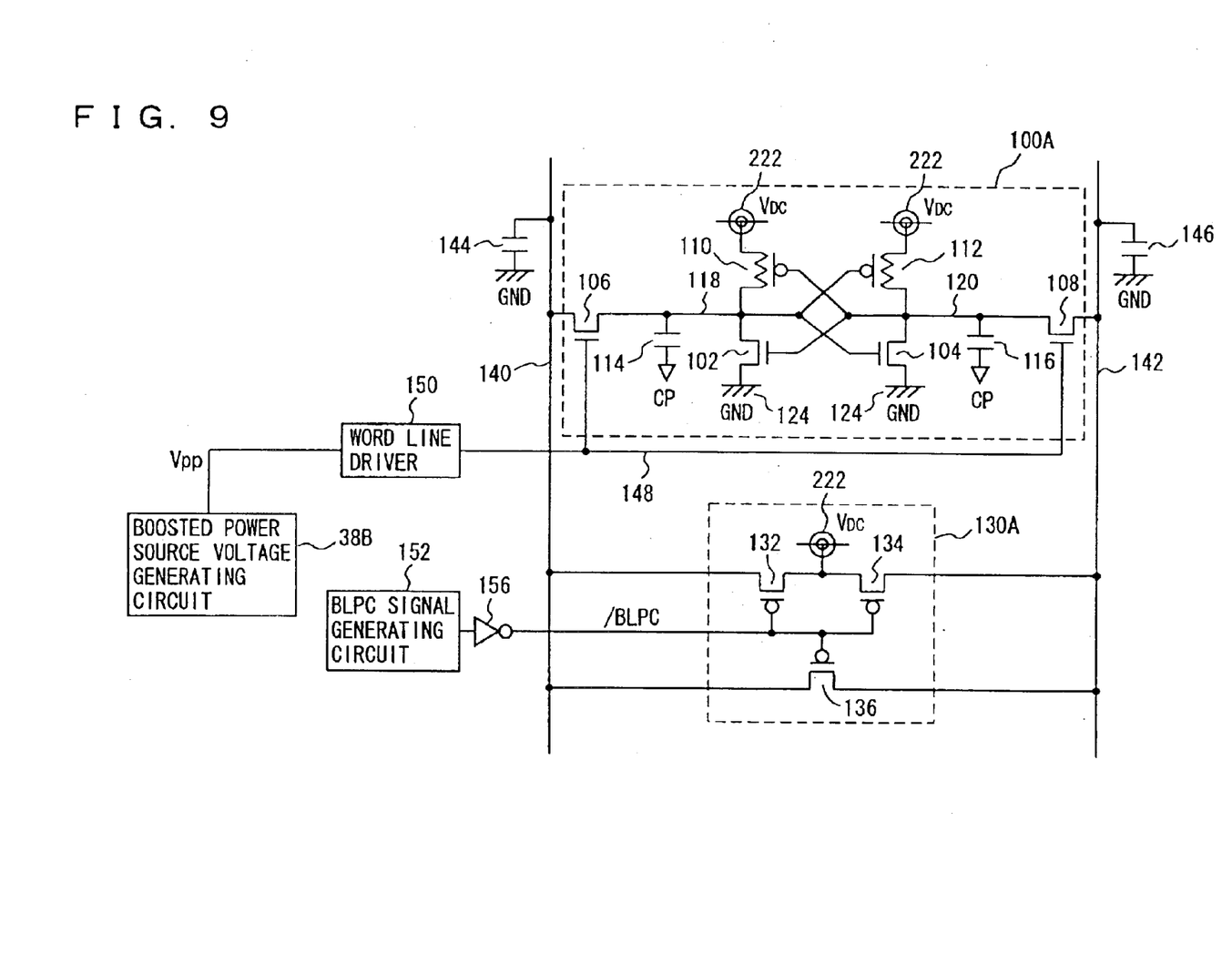
FIG. 9 is a circuit diagram showing the configuration of one of memory cells arranged in a matrix in a memory cell array and its peripheral circuits in the semiconductor memory device according to the third embodiment.

FIG. 9 is a circuit diagram showing the configuration of one of memory cells arranged in a matrix in memory cell array 36A and its peripheral circuits in semiconductor memory device 10B according to the third embodiment.

Referring to FIG. 9, a memory cell 100A and a bit line precharge circuit 130A include, in the configuration of memory cell 100 and bit line precharge circuit 130 in the first embodiment, power source nodes 222 to which voltage $V_{DC}$ outputted from not-shown step-down power source generating circuit 40 is applied in place of power source nodes 122 of power source potential Vcc.

Since the other configuration of memory cell 100A and the other configuration of bit line precharge circuit 130A is the same as that of memory cell 100 and that of bit line precharge circuit 130, respectively, its description will not be repeated. Since the operation of memory cell 100A and its peripheral circuits is the same as that of memory cell 100 and its peripheral circuits in the first embodiment, its description will not be repeated.

In the third embodiment, voltage $V_{DC}$ controlled to a predetermined potential by step-down power source generating circuit 40 is supplied to memory cell 100A and bit line precharge circuit 130A, so that the capacitance values of capacitors 114 and 116 included in memory cell 100A can be minimized.

Specifically, when the parasitic capacitance of bit lines 140 and 142 is Cb and the potential of the bit line is Vb, quantity Q of electric charges flowed from the bit line to the storage node at a ground potential in the writing operation is expressed by the following equation (2).

$$Q=Cb \times Vb \qquad (2)$$

As understood from the equation (2), when voltage Vb fluctuates, the quantity Q of electric charges flowed fluctuates. Particularly, when voltage Vb fluctuates to the higher side, the quantity Q of electric charges increases. Increase in electric charge quantity Q causes increase in the potential of a storage node and causes erroneous operation in a driver transistor. Therefore, to realize a memory cell robust to fluctuations in voltage, the capacitance values of capacitors 114 and 116 have to have a margin.

In the third embodiment, however, voltage Vb is voltage $V_{DC}$ controlled to a predetermined potential by step-down power source generating circuit 40, so that the quantity Q of electric charges flowed to memory cell 100A also becomes constant. Consequently, the capacitance values of capacitors 114 and 116 included in memory cell 100A are minimized. Therefore, in memory cell 100A, charge time of capacitor 114 or 116 is minimized at the time of writing data.

As described above, in semiconductor memory device 10B according to the third embodiment, the quantity of electric charges to be supplied from the bit line to a memory cell is stabilized at the time of reading/writing data. Consequently, the capacitance value of a capacitor included in a memory cell can be minimized and, as a result, writing operation time is shortened.

Fourth Embodiment

In a fourth embodiment, voltage $V_{DC}$ controlled to a predetermined potential by step-down power source generating circuit 40 is used and, further, the bit line precharge circuit is constructed by N-channel MOS transistors.

Referring again to FIG. 8, a semiconductor memory device 10C according to the fourth embodiment has the same configuration as that of semiconductor memory device 10B according to the third embodiment except that a boosted power source voltage generating circuit 38C is provided in place of boosted power source voltage generating circuit 38B. Boosted power source voltage generating circuit 38C is different from boosted power source voltage generating circuit 38B with respect to the points that it outputs generated voltage Vpp to a word line driver included in row address decoder 30 and also to a not-shown BLPC signal generating circuit. The other configuration of semiconductor memory device 10C is similar to that of semiconductor memory device 10B, so that its description will not be repeated.

Figure 10:
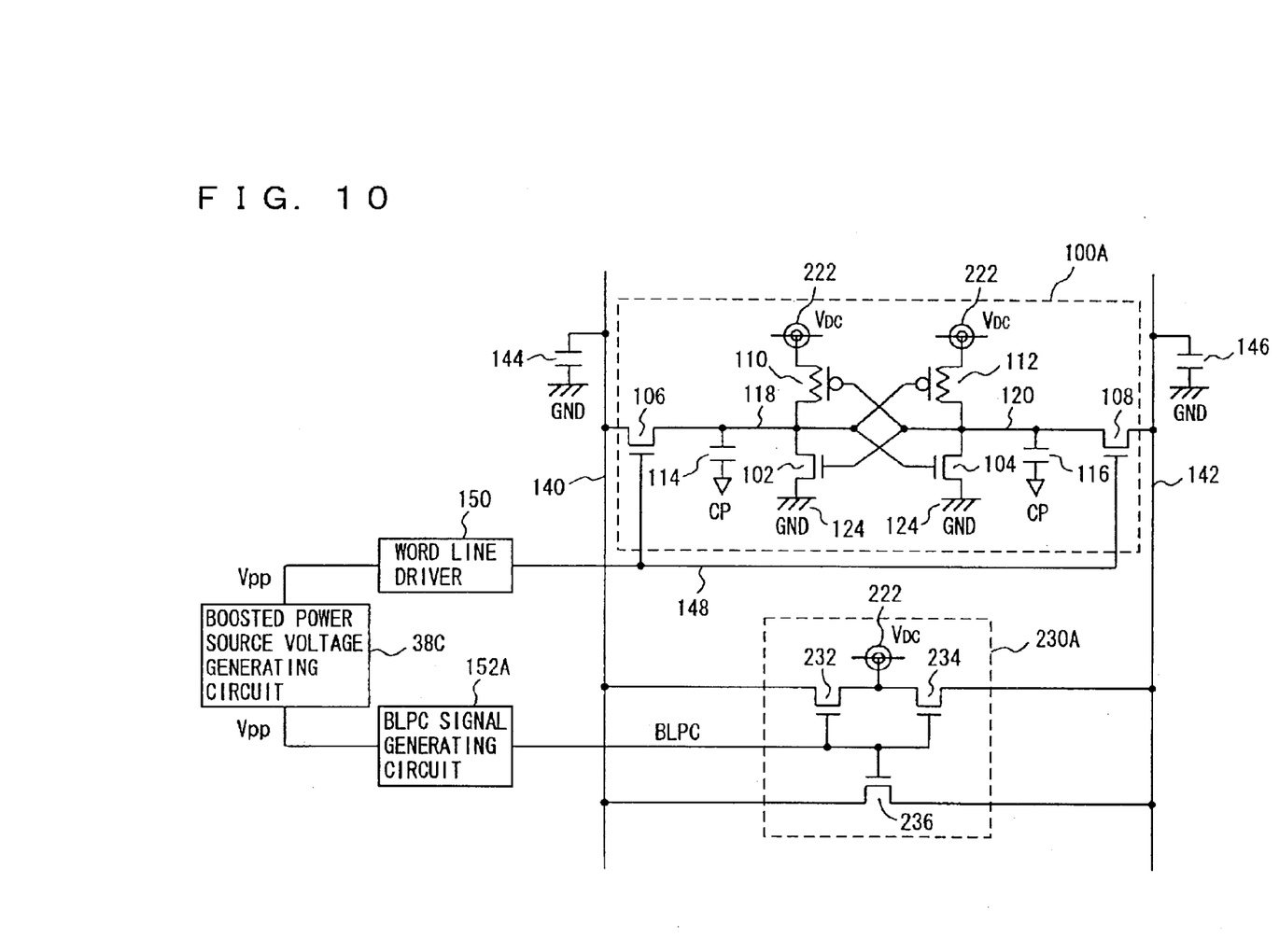
FIG. 10 is a circuit diagram showing the configuration of one of memory cells arranged in a matrix in a memory cell array and its peripheral circuits in a semiconductor memory device according to a fourth embodiment.

FIG. 10 is a circuit diagram showing the configuration of one of memory cells arranged in a matrix in memory cell array 36A and its peripheral circuits in semiconductor memory device 10C according to the fourth embodiment.

Referring to FIG. 10, a bit line precharge circuit 230A is connected to the pair of bit lines 140 and 142. Bit line precharge circuit 230A has the same configuration as that of bit line precharge circuit 230 in the second embodiment except that power source node 222 to which voltage $V_{DC}$ controlled to a predetermined voltage is applied is included in place of power source node 122 of power source potential Vcc. Since the other configuration of bit line precharge circuit 230A is the same as that of bit line precharge circuit 230, its description will not be repeated.

Since the configuration of the other circuits shown in FIG. 10 is the same as that of the circuits shown in FIG. 7, its description will not be repeated. Since the operation of memory cell 100A and its peripheral circuit in the fourth embodiment is the same as that of memory cell 100 and its peripheral circuit in the first embodiment, its description will not be repeated.

In semiconductor memory device 10C according to the fourth embodiment, the quantity of electric charges supplied from a bit line to a memory cell at the time of reading/writing data is stabilized and, further, bit line precharge circuit 230A is constructed by N-channel MOS transistors of the same conductive type as that of bulk transistors constructing memory cell 100A. Thus, write operation time is shortened and the device area is also reduced.

Although the cell ratio of a memory cell is 1 in the foregoing embodiments, if the cell ratio is lower than 2, the effect of reducing the cell area in a conventional SRAM in which the cell ratio lies in a range from 2.5 to 3 is produced.

Although stable reading operation is realized even when the cell ratio is 1 by providing capacitors 114 and 116 in the foregoing embodiments, when storage nodes 118 and 120 have capacitance values corresponding to capacitors 114 and 116, it is unnecessary to provide storage nodes 118 and 120 with capacitors. In this case as well, functions similar to those in the case where capacitors 114 and 116 are provided can be realized.

Further, although P-channel TFTs 110 and 112 are provided as load elements in the foregoing embodiments, high-resistive elements made of polysilicon may be provided in place of P-channel TFTs 110 and 112.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a memory cell storing data;

a word line connected to said memory cell;

a pair of bit lines connected to said memory cell and each having a first capacitance value;

a bit line precharge circuit precharging said pair of bit lines to a power source potential;

a boosted voltage generating circuit generating a voltage of a first potential higher than said power source potential; and a word line activating circuit receiving said voltage of the first potential from said boosted voltage generating circuit and activating said word line with said voltage of the first potential, wherein said memory cell includes:

first and second inverters each of which has a load element and a drive element and which are cross-coupled;

a first storage node connected to an output node of said first inverter and an input node of said second inverter and having a second capacitance value which is equal to or larger than ⅛ of said first capacitance value;

a second storage node connected to an output node of said second inverter and an input node of said first inverter and having said second capacitance value; and first and second gate elements connecting said first and second storage nodes to one bit line in said pair of bit lines and the other bit line, respectively, and current drivability of said drive element is lower than twice of current drivability of said first and second gate elements.

2. The semiconductor memory device according to claim 1, wherein said memory cell further includes:

a first capacitive element whose one end is connected to said first storage node and whose other end is connected to a constant potential node; and a second capacitive element whose one end is connected to said second storage node and whose other end is connected to said constant potential node, and said first and second storage nodes have said second capacitance value when said first and second capacitive elements are connected to said first and second storage nodes, respectively.

3. The semiconductor memory device according to claim 1, wherein said drive element includes a first transistor of a first conductive type, said first and second gate elements include second transistors of the first conductive type, and said load element includes a resistive element formed of polysilicon with high resistance.

4. The semiconductor memory device according to claim 3, wherein said resistive element includes a thin film transistor of a second conductive type.

5. The semiconductor memory device according to claim 3, wherein
said second capacitance value is a value such that the potential of said first storage node which is increased by electric charges supplied from said one bit line to said first storage node in the reading operation does not exceed a threshold voltage of said first transistor.

6. The semiconductor memory device according to claim 3, wherein
said power source potential is lower than a second potential which is a sum of the value of a threshold voltage of said first transistor and the value of a threshold voltage of said second transistor.

7. The semiconductor memory device according to claim 3, wherein
said first potential is higher than a second potential which is higher than said power source potential by a threshold voltage of said second transistor.

8. The semiconductor memory device according to claim 3, wherein
said bit line precharge circuit includes a transistor of the first conductive type receiving the voltage of said first potential by its gate to operate.

9. The semiconductor memory device according to claim 3, wherein
said bit line precharge circuit includes a transistor of a second conductive type receiving the voltage of said power source potential by its gate to operate.

10. The semiconductor memory device according to claim 1, further comprising:
an internal power source generating circuit generating an internal voltage of said power source potential with a constant value on the basis of an external power source voltage, wherein
said memory cell and said bit line precharge circuit operate by receiving said internal voltage supplied from said internal power source generating circuit.

11. The semiconductor memory device according to claim 1, wherein
said current drivability of said drive element is in a range from 0.8 to 1.2 of said current drivability of said first and second gate elements.

12. A semiconductor memory device comprising:
a memory cell array including a plurality of memory cells arranged in a matrix for storing data;
a plurality of word lines arranged in correspondence with rows of said memory cell array;
a plurality of bit line pairs arranged in correspondence with columns of said memory cell array, each bit line having a first capacitance value;
a plurality of bit line precharge circuits each precharging a corresponding pair of bit lines to a power source potential;
a boosted voltage generating circuit generating a voltage of a predetermined potential higher than said power source potential; and
a plurality of word line activating circuits each receiving said voltage of the predetermined potential from said boosted voltage generating circuit and activating a corresponding word line with said voltage of the predetermined potential, wherein
each of said plurality of memory cells includes:
first and second inverters each of which has a load element and a drive element and which are cross-coupled;
a first storage node connected to an output node of said first inverter and an input node of said second inverter and having a second capacitance value which is equal to or larger than ⅛ of said first capacitance value;
a second storage node connected to an output node of said second inverter and an input node of said first inverter and having said second capacitance value; and
first and second gate elements connecting said first and second storage nodes to one bit line in the corresponding pair of bit lines and the other bit line, respectively,
current drivability of said drive element is lower than twice of current drivability of said first and second gate elements, and
when any of said plurality of word lines is activated, the bit line precharge circuit corresponding to the pair of bit lines which perpendicularly cross the activated word line is made inactive.

* * * * *